United States Patent
Masuda

(10) Patent No.: US 8,168,525 B2
(45) Date of Patent: May 1, 2012

(54) ELECTRONIC PART MOUNTING BOARD AND METHOD OF MOUNTING THE SAME

(75) Inventor: Kouki Masuda, Tokyo (JP)

(73) Assignee: NEC Corporation, Tokyo (JP)

( * ) Notice: Subject to any disclaimer, the term of this patent is extended or adjusted under 35 U.S.C. 154(b) by 375 days.

(21) Appl. No.: 12/039,285

(22) Filed: Feb. 28, 2008

(65) Prior Publication Data

US 2008/0212301 A1   Sep. 4, 2008

(30) Foreign Application Priority Data

Mar. 1, 2007 (JP) ................................ 2007-051267

(51) Int. Cl.
  *H01L 21/44* (2006.01)
(52) U.S. Cl. ........ 438/612; 174/263; 361/760; 361/767; 29/832
(58) Field of Classification Search .......... 174/255–257, 174/259, 260–267; 361/760, 762, 765, 767, 361/768, 770, 808, 728, 739, 742, 743, 745, 361/746, 748, 750, 751, 795, 790; 257/762, 257/678, 737, 738, 778, 679; 438/612–613; 29/832–834

See application file for complete search history.

(56) References Cited

U.S. PATENT DOCUMENTS

| | | | | |
|---|---|---|---|---|
| 5,384,952 A * | 1/1995 | Matsui | ............................. | 29/840 |
| 6,281,452 B1 * | 8/2001 | Prasad et al. | .................. | 174/262 |
| 6,291,899 B1 * | 9/2001 | Wensel et al. | .................. | 257/787 |
| 6,329,609 B1 * | 12/2001 | Kaja et al. | ...................... | 174/262 |
| 2004/0023147 A1 * | 2/2004 | Hirano et al. | .................. | 430/191 |
| 2004/0134682 A1 * | 7/2004 | En et al. | .......................... | 174/258 |
| 2004/0160751 A1 * | 8/2004 | Inagaki et al. | ................. | 361/763 |
| 2004/0168825 A1 * | 9/2004 | Sakamoto et al. | ............. | 174/260 |
| 2005/0142835 A1 * | 6/2005 | Ball et al. | ....................... | 438/612 |
| 2005/0186430 A1 * | 8/2005 | Amagai et al. | ................. | 428/413 |
| 2005/0280130 A1 * | 12/2005 | Nakai | ............................ | 257/678 |
| 2006/0110907 A1 * | 5/2006 | Sakurai et al. | ................ | 438/612 |

FOREIGN PATENT DOCUMENTS

| | | |
|---|---|---|
| JP | 57-210638 | 12/1982 |
| JP | 6-268362 | 9/1994 |
| JP | 07-015122 | 1/1995 |
| JP | 10-98261 | 4/1998 |
| JP | 2003-204148 | 7/2003 |

OTHER PUBLICATIONS

Japanese Official Action dated May 6, 2011 together with a partial English language translation from JP 2007-051267.

* cited by examiner

*Primary Examiner* — Hoa C Nguyen

(74) *Attorney, Agent, or Firm* — Scully, Scott, Murphy & Pressser, PC

(57) ABSTRACT

An electronic part mounting board includes an insulating board, a pad formed on the insulating board, a bump formed on the pad, and a film having heat resistance and electrical insulating properties and formed on the insulating board except the pad and the bump. A method of mounting an electronic part on the mounting board is also disclosed.

4 Claims, 5 Drawing Sheets

ELECTRONIC PART MOUNTING BOARD AND METHOD OF MOUNTING THE SAME

This application is based upon and claims the benefit of priority from Japanese patent application No. 2007-051267, filed on Mar. 1, 2007, the disclosure of which is incorporated herein in its entirety by reference.

BACKGROUND OF THE INVENTION

The present invention relates to a board on which an electronic part is mounted and a method of mounting the same.

Conventionally, to mount a semiconductor chip (or a BOA (Ball Grid Array)) on a board, solder bumps 102 are respectively formed on pads 101 on a board 100, as shown in FIG. 4A. A flux 103 is applied to the board 100, as shown in FIG. 4B. A semiconductor chip (or BGA) 104 is mounted on the board 100, as shown in FIG. 4C. The semiconductor chip (or BOA) and the board 100 are soldered by a reflow, as shown in FIG. D.

Reference 1 (Japanese Patent Laid-Open No. 57-210638) discloses another conventional mounting method. As shown in FIG. 5, according to this mounting method, to perform soldering by a reflow, a frame-like flow preventing member (dam) 204 is formed to prevent solder bumps 202 from flowing outside corresponding pads 201. Referring to FIG. 5, reference numeral 200 denotes a board; and 203, a semiconductor chip.

Reference 2 (Japanese Patent Laid-Open No. 7-015122) discloses still another conventional mounting method. As shown in FIG. 6, according to this mounting method, a cream solder is filled to form cream solder portions 305 in corresponding openings of a film having electrical insulation and heat resistance properties to prepare a bonding film assembly 304. The bonding film assembly 304 is fed onto a board 300 to overlap the cream solder portions 305 on corresponding pads 301 of the board 300. An electronic part 302 is fed onto the film assembly 304 to overlap leads 303 of the electronic part 302 onto the corresponding cream solder portions 305. The board 300 is heated to melt the cream solder portions 305. As described above, the film assembly 304 prevents the overflow of the cream solder portions 305.

According to the conventional mounting method shown in FIGS. 4A to 4D, a soldering failure such as a solder short 105 and a solder wetting failure 106 may occur in the step shown in FIG. 4D, thereby posing a problem.

The mounting method disclosed in reference 1 can prevent the solder bump flow outside the corresponding pad. However, like in FIGS. 4A to 4D, soldering failures cannot be prevented.

The mounting method disclosed in reference 2, to mount a bare chip with a small pitch, the paste flowing from the film shorts, resulting in a soldering failure.

SUMMARY OF THE INVENTION

The present invention has been made to solve the conventional problems described above and has as its object to reduce soldering failures.

According to an aspect of the present invention, there is provided an electronic part mounting board comprising an insulating board, a pad formed on the insulating board, a bump formed on the pad, and a film having heat resistance and electrical insulating properties and formed on the insulating board except the pad and the bump.

According to another aspect of the present invention, there is provided a method of mounting an electronic part, comprising the steps of preparing an electronic part mounting board, the mounting board including an insulating board, a pad formed on the insulating board, a bump formed on the pad, and a film having heat resistance and electrical insulating properties and formed on the insulating board except the pad and the bump, placing the electronic part on the mounting board so that an electrode of the electronic part overlaps the bump, and melting the solder bump to bond the pad and the electrode of the electronic part by solder.

DESCRIPTION OF THE PREFERRED EMBODIMENT

An embodiment of the present invention will be described with reference to the accompanying drawings.

Figure 1A:
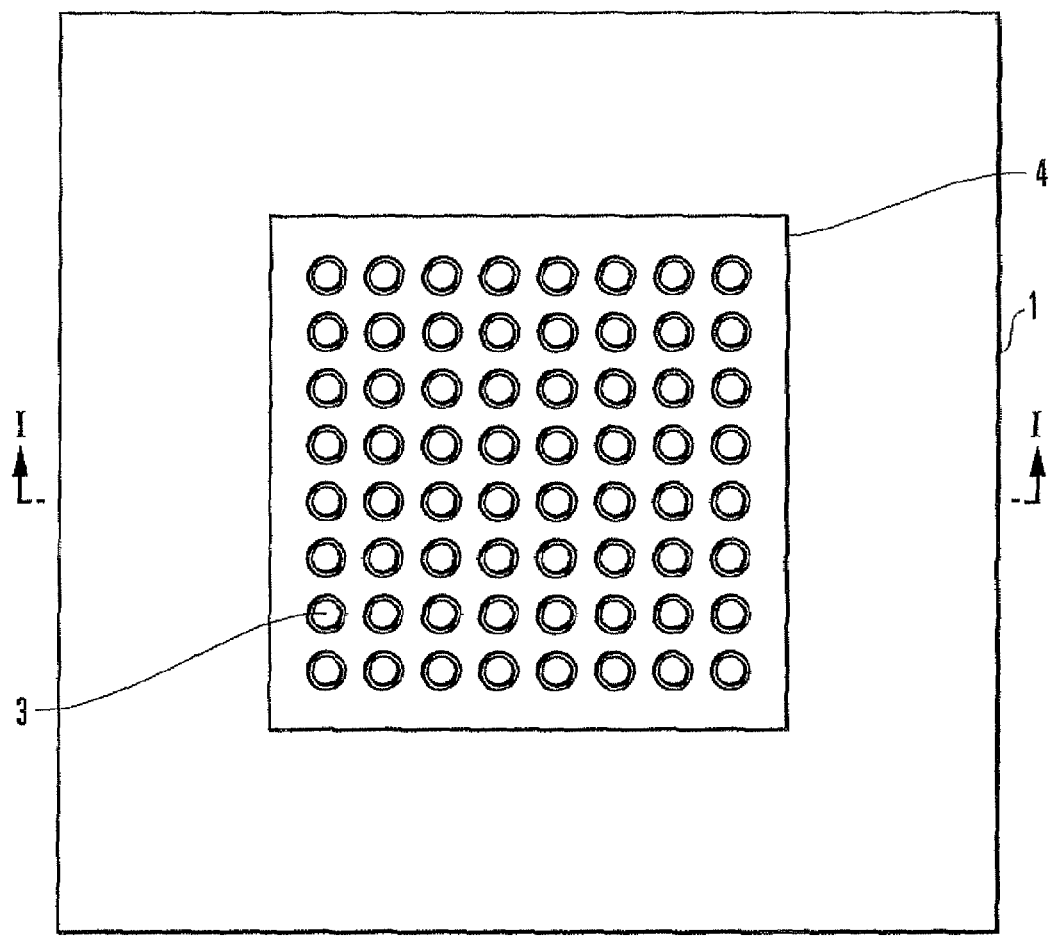
FIG. 1A is a plan view showing a mounting board according to an embodiment of the present invention.
Figure 1B:
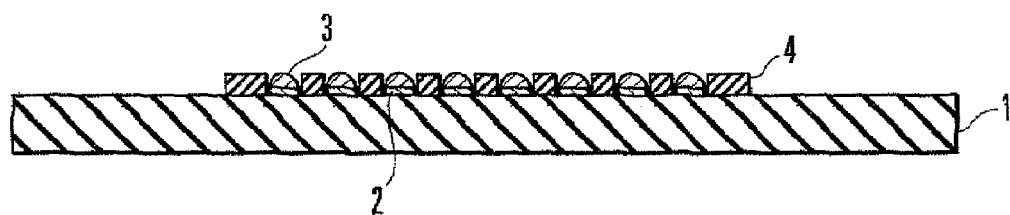
FIG. 1B is a sectional view taken along the line I-I of the mounting board in FIG. 1A.

As shown in FIGS. 1A and 1B, a mounting board according to an embodiment of the present invention comprises an insulating board 1 on which an electronic part such as a semiconductor chip or BGA is mounted, pads 1 serving as conductive layers connected to the corresponding electrodes of the electronic part, bumps 3 respectively formed on the pads 2, and a film 4 having electrical insulating and heat resistance properties and formed on the insulating board 1.

This mounting board is characterized in that the film 4 is formed on the insulating board 1 except the bumps 3. The film 4 has the electrical insulating properties and heat resistance against the reflow temperature when mounting an electronic part. If the film 4 must be removed upon mounting the electronic part, a material such as a polyimide film soluble with an organic solvent can be used as the material of the film 4. The height of the film 4 is larger than that of each pad 2.

A method of manufacturing a mounting board and a method of mounting an electronic part on the mounting board according to this embodiment will be described below.

Figure 2A:
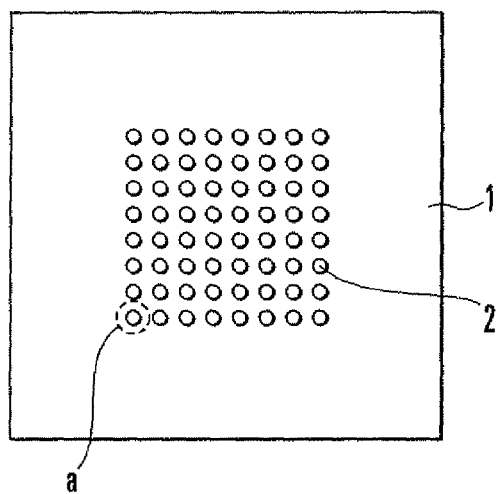
FIGS. 2A to 2C are plan views showing a method of manufacturing the mounting board shown in FIG. 1.
Figure 2D:
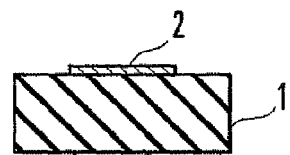
FIGS. 2D to 2F are enlarged sectional views of a portion indicated by a point a in each of FIGS. 2A to 2C.
Figure 2B:
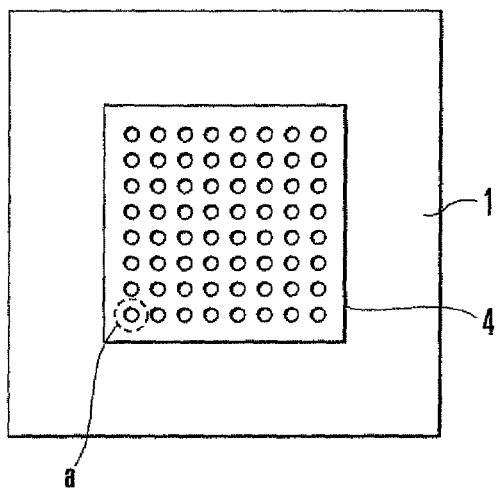
Figure 2E:
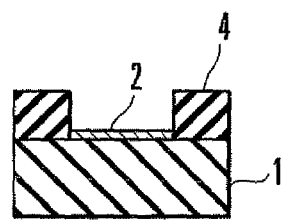

First of all, the method of manufacturing a mounting board will be described with reference to FIGS. 2A to 2F. As shown in FIGS. 28 and 2E, a film 4 is formed on an insulating substrate 1 shown in FIGS. 2A and 2D except pads 2. When the film is formed using soluble polyimide, for example, the polyimide is applied to the insulating board 1 and cured. The polyimide is patterned by etching to remove the polyimide corresponding to the pads 2.

Figure 2C:
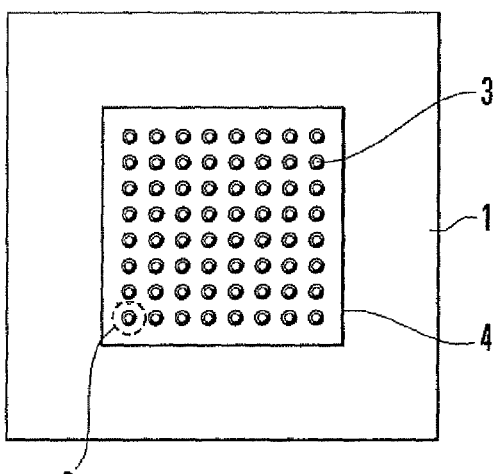
Figure 2F:
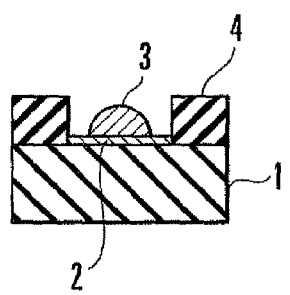

Subsequently, as shown in FIGS. 2C and 2F, bumps 3 are respectively formed on the pads 2, thus finishing the mounting board shown in FIGS. 1A and 1B.

In the order opposite to that described above, the bumps 3 may be formed on the pads 3, respectively, and then the film 4 may be formed on the insulating board 1 except the pads 2 and the bumps 3.

Figure 3A:
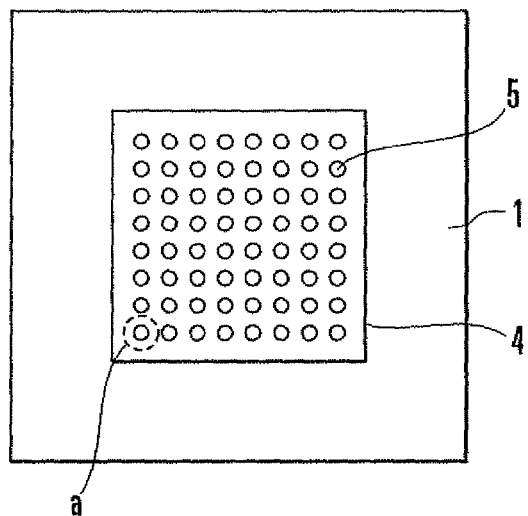
FIGS. 3A and 3B are plan views showing a method of mounting an electronic part on the mounting board shown in FIG. 1.
Figure 3C:
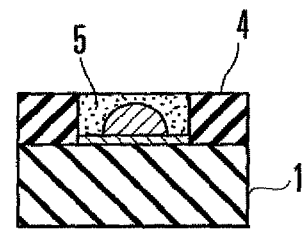
FIGS. 3C and 3D are enlarged sectional views showing a portion indicated by a point a in each of FIGS. 3A and 3B.

The method of mounting an electronic part on the mounting board will be described with reference to FIGS. 3A to 3D. As shown in FIGS. 3A and 3C, a flux 5 is applied to a mounting board. Note that this step may be omitted.

Figure 3B:
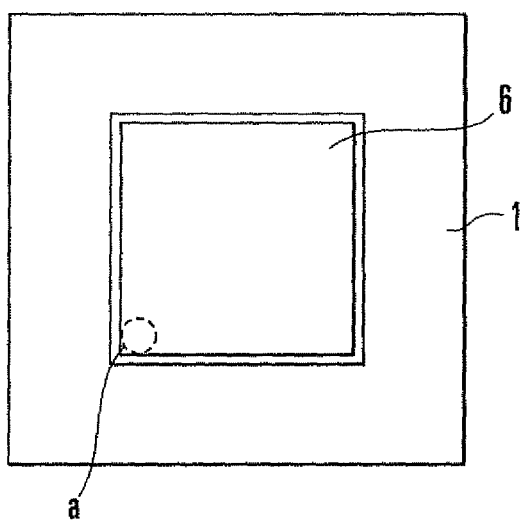
Figure 3D:
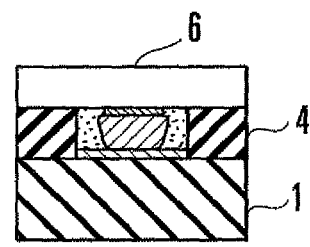
Figure 4A:
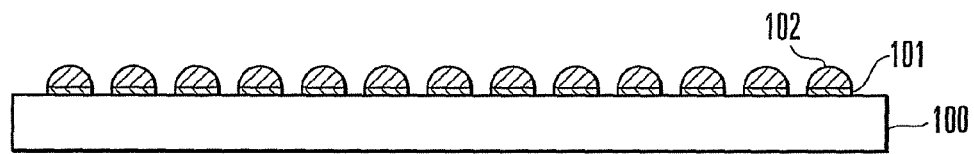
FIGS. 4A to 4D are sectional views showing a conventional mounting method of mounting a semiconductor chip or BGA on a board.
Figure 4B:
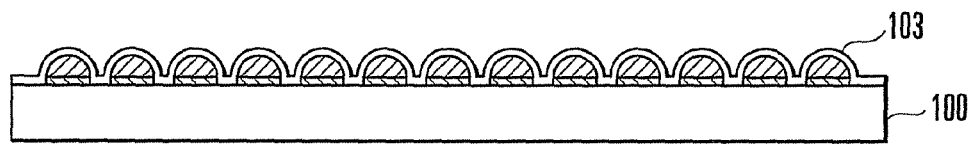
Figure 4C:
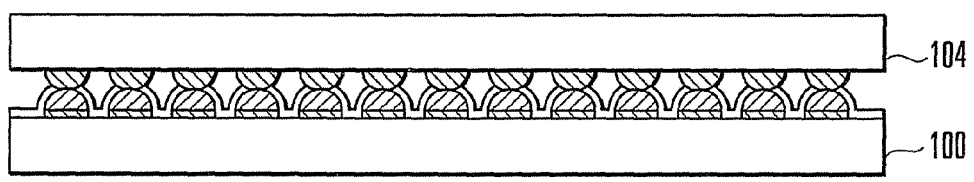
Figure 4D:
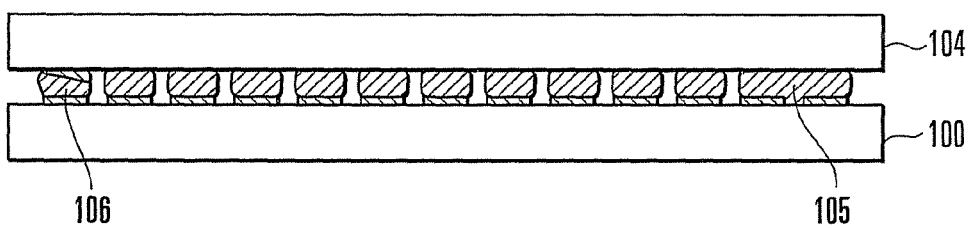
Figure 5:
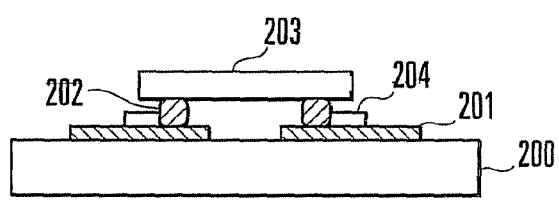
FIG. 5 is a sectional view of an integrated circuit showing another conventional mounting method.
Figure 6:
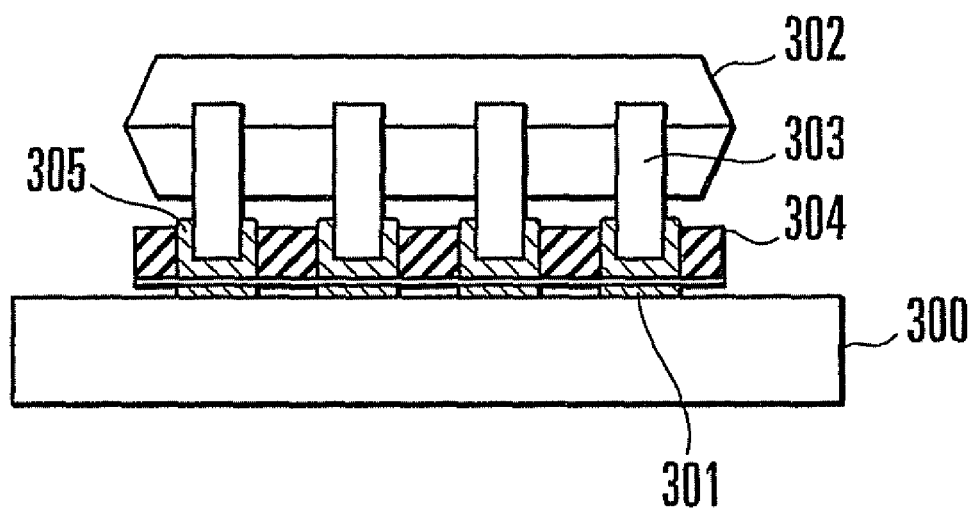
FIG. 6 is a sectional view of an integrated circuit showing still another conventional mounting method.

Subsequently, an electronic part 6 such as a semiconductor chip or BGA is placed on the mounting board such that the electrodes of the electronic part 6 respectively overlap bumps 3. A load such as a counterweight is placed on the electronic part 6 to melt the solder bumps 3 by the reflow, thereby bonding the pads 2 and the corresponding electrodes of the electronic part 6 by the solder. As shown in FIGS. 3B and 3D, the electronic part 6 is completely mounted on the mounting board.

If the film 4 must be removed, the film 4 is removed with an organic solvent or the like after the steps in FIGS. 3B and 3D.

As described above, according to this embodiment, the film 4 is sandwiched between the electronic part 6 and the insulating board 1 to eliminate the shortage of the flux 5 during the reflow. The stand-off height between the electronic part 6 and the insulating board 1 can be ensured. Therefore, the reflow can be performed while applying the load on the electronic part 6. This makes it possible to prevent solder wetting failures and positional errors between the electronic part 6 and the insulating board 1.

According to this embodiment, since the adjacent bumps can be perfectly separated from each other by the film 4, the solder short can be prevented.

According to this embodiment, the stand-off height after the reflow can be controlled by the thickness of the film.

According to this embodiment, when the soluble film 4 is used, the film 4 can be removed by dissolution upon mounting the electronic part 6.

The present invention is applicable to mounting of an electronic part such as a semiconductor chip or BGA.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A method of mounting an electronic part, comprising the steps of:
   preparing an electronic part mounting board, the mounting board including an insulating substrate, a pad formed on the insulating substrate, a bump formed on the pad, and a film having heat resistance and electrical insulating properties and formed on the insulating substrate except the pad and the bump, the preparing step including:
   forming the film on the insulating substrate except the pad on the insulating substrate, the forming the film including:
   applying a polyimide to the insulating substrate and curing the polyimide; and
   removing the cured polyimide by etching at a portion thereof positionally corresponding to the pad;
   forming the bump lower than the film on the pad after forming the film;
   placing the electronic part on the mounting board so that an electrode of the electronic part overlaps the bump; and
   melting the bump to bond the pad and the electrode of the electronic part by solder.

2. A method according to claim 1, further comprising a step of removing the film after bonding, the film being soluble.

3. A method of mounting an electronic part, comprising the steps of:
   preparing an electronic part mounting board, the mounting board including an insulating substrate, a pad formed on the insulating substrate, a bump formed on the pad, and a film having heat resistance and electrical insulating properties and formed on the insulating substrate except the pad and the bump, the preparing step including:
   forming the bump on the pad on the insulating substrate;
   forming the film higher than the bump on the insulating substrate except the pad and the bump after forming the bump, the forming the film including:
   applying a polyimide to the insulating substrate and curing the polyimide; and
   removing the cured polyimide by etching at a portion thereof positionally corresponding to the pad;
   placing the electronic part on the mounting board so that an electrode of the electronic part overlaps the bump; and
   melting the bump to bond the pad and the electrode of the electronic part by solder.

4. A method according to claim 3, further comprising a step of removing the film after bonding, the film being soluble.

* * * * *